United States Patent
Nie et al.

(10) Patent No.: US 11,587,625 B1
(45) Date of Patent: Feb. 21, 2023

(54) SENSITIVE AMPLIFIER AND STORAGE DEVICE

(71) Applicant: CHINA FLASH CO., LTD., Shanghai (CN)

(72) Inventors: Hong Nie, Shanghai (CN); Zeyu Zhu, Shanghai (CN); Ying Sun, Shanghai (CN); Yihe Shen, Shanghai (CN)

(73) Assignee: CHINA FLASH CO., LTD., Shanghai (CN)

(*) Notice: Subject to any disclaimer, the term of this patent is extended or adjusted under 35 U.S.C. 154(b) by 0 days.

(21) Appl. No.: 17/878,489

(22) Filed: Aug. 1, 2022

(30) Foreign Application Priority Data

Sep. 2, 2021 (CN) .......................... 202111027660.5

(51) Int. Cl.
*G11C 7/00* (2006.01)
*G11C 16/26* (2006.01)

(52) U.S. Cl.
CPC .................................... *G11C 16/26* (2013.01)

(58) Field of Classification Search
CPC ......... G11C 7/12; G11C 11/4094; G11C 7/22; G11C 7/1048; G11C 11/4091
USPC .................... 365/203, 204, 189.07
See application file for complete search history.

(56) References Cited

U.S. PATENT DOCUMENTS

| 10,083,746 B2 * | 9/2018 | Park ................... G11C 13/0026 |
| 2006/0158935 A1 * | 7/2006 | Chan ........................ G11C 7/08 365/185.17 |

FOREIGN PATENT DOCUMENTS

| CN | 101217059 A | 7/2008 |
| CN | 107195319 A | 9/2017 |
| CN | 111383674 A | 7/2020 |

* cited by examiner

*Primary Examiner* — Son T Dinh
(74) *Attorney, Agent, or Firm* — Global IP Services; Tianhua Gu

(57) ABSTRACT

A sensitive amplifier and a storage device are provided, and the sensitive amplifier includes: a voltage clamp circuit which provides a stable reading voltage for the storage unit; a power switch circuit which cuts off power supply for the voltage clamp circuit when the voltage clamp circuit is not operating; a discharge circuit which discharges the voltage clamp circuit before the voltage clamp circuit operates; a pre-charge circuit which pre-charges the voltage clamp circuit when the voltage clamp circuit starts operating; and a current comparison circuit which is connected to an output of the voltage clamp circuit, compares the reading current with a reference current, and outputs a comparison result.

9 Claims, 2 Drawing Sheets

SENSITIVE AMPLIFIER AND STORAGE DEVICE

CROSS REFERENCE TO RELATED APPLICATION

The present application claims the benefit of priority to Chinese Patent Application No. CN 2021110276605, entitled "SENSITIVE AMPLIFIER AND STORAGE DEVICE", filed with CNIPA on Sep. 2, 2021, the disclosure of which is incorporated herein by reference in its entirety for all purposes.

FIELD OF TECHNOLOGY

The present disclosure relates to the field of memory, in particular, to a to sensitive amplifier and a storage device.

BACKGROUND

The rapid development and widespread use of modern electronic devices and embedded structures have led to an increasing demand for highly integrated circuit chips, which has further given rise to a series of requirements on the power consumption of integrated circuit chips. For storage devices, reducing the chip power consumption of FLASH memory has been the goal pursued by high-capacity or even very large-capacity FLASH memory chips.

Non-volatile memories require sensitive amplifiers for read operations; high standby power consumption, slow clamp voltage build-up time, and unstable initial state of sensitive amplifiers are problems facing sensitive amplifiers. Therefore, how to effectively reduce the standby power consumption of a sensitive amplifier, increase the speed of pre-charging a clamp voltage of the sensitive amplifier; and prevent the sensitive amplifier from being in an unstable state internally has become one of the pressing issues for those skilled in the art

SUMMARY

The present invention provides a sensitive amplifier, including:
a voltage clamp circuit, connected to a memory cell to provide a stable reading voltage for the memory cell
a power switch circuit, connected between a supply voltage and the voltage clamp circuit, wherein the power switch circuit cuts off a path between the voltage clamp circuit and the supply voltage when the voltage clamp circuit is not operating;
a discharge circuit, connected to the voltage clamp circuit, discharging the voltage clamp circuit before the voltage clamp circuit operates;
a pre-charge circuit, connected to the voltage clamp circuit, pre-charging the voltage clamp circuit when the voltage clamp circuit starts to operate; and
a current comparison circuit, connected to an output end of the voltage clamp circuit, comparing a readout current at the output end of the voltage clamp circuit with a reference current and outputting a comparison result.

Optionally, the sensitive amplifier further includes a latching circuit, connected to an output end of the current comparison circuit for latching the comparison result.

Optionally, the sensitive amplifier further includes a buffer circuit connected between the current comparison circuit and the latching circuit.

Optionally, the reading voltage is clamped between 0.8 V and 1.1 V.

Optionally, the voltage clamp circuit includes an inverting module and a clamp metal-oxide-semiconductor field-effect transistor (MOSFET); wherein a first end of the clamp MOSFET is connected to the memory cell, a second end of the clamp MOSFET outputs the readout current, and a control end of the clamp MOSFET is connected to an output end of the inverting module; wherein an input end of the inverting module is connected to the first end of the clamp MOSFET.

Optionally, the power switch circuit includes a switching MOSFET, a first end of the switching MOSFET is connected to a supply voltage, a second end of the switch circuit is connected to an input of the operating voltage of the inverting module, and a control end of the switching MOSFET receives a first control signal.

Optionally, the discharge circuit includes a first pull-down MOSFET and a second pull-down MOSFET; wherein a first end of the first pull-down MOSFET is grounded and a second end of the first pull-down MOSFET is connected to the control end of the clamp MOSFET, and the control end of the first pull-down MOSFET receives a second control signal; wherein a first end of the second pull-down MOSFET is grounded, a second end of the second pull-down MOSFET is connected to the input end of the inverting module, and a control end of the second to pull-down MOSFET receives the second control signal.

Optionally, the pre-charging circuit includes a pre-charging MOSFET, wherein a first end of the pre-charging MOSFET is connected to the supply voltage, the second end of the pre-charging MOSFET is connected to the second end of the clamp MOSFET, and the control end of the pre-charging MOSFET receives a third control signal.

Optionally, the current comparison circuit includes a current mirror and a current source; one end of the current mirror is connected to the output end of the voltage clamp circuit that outputs the readout current, and the other end of the current mirror is connected to the current source and outputs the comparison result.

The present disclosure further provides a storage device, including: a controller, a memory, and the sensitive amplifier described above.

The controller is connected to the memory and the sensitive amplifier, providing control signals to the memory and the sensitive amplifier.

The memory is used for storing data.

The sensitive amplifier is connected to the memory for reading out the data stored in the memory.

Optionally, the memory is a non-volatile memory.

As described above, the present disclosure has the following advantages:

The sensitive amplifier and storage device of the present disclosure can effectively reduce the standby power consumption of the sensitive amplifier by cutting off the path between the voltage clamp circuit and the supply voltage by the power switch circuit when the read operation is not performed.

The pre-charge circuit of the sensitive amplifier and storage device of the present disclosure can effectively improve the speed of pre-charging the clamp voltage of the sensitive amplifier by pre-charging the voltage clamp circuit before the read operation.

The sensitive amplifier and storage device of the present disclosure can effectively prevent the sensitive amplifier from being in an unstable state internally by zeroing the potential at each point of the voltage clamp circuit before the read operation through the discharge circuit.

REFERENCE NUMERALS

1—Sensitive amplifier; 11—Voltage clamp circuit; 111—Inverting module; 12—Power switch circuit; 13—Discharge circuit; 14—Pre-charge circuit; 15—Current comparison circuit; 151—Current mirror; 152—Current source; 16—Buffer circuit; 17—Latching circuit; 2—Controller; 3—Memory.

DETAILED DESCRIPTION

The following describes the implementation of the present disclosure through specific examples, and those skilled in the art can easily understand other advantages and effects of the present disclosure from the content disclosed in this specification. The present disclosure can also be implemented or applied through other different specific embodiments. Various details in this specification can also be modified or changed based on different viewpoints and applications without departing from the spirit of the present disclosure.

Figure 1:
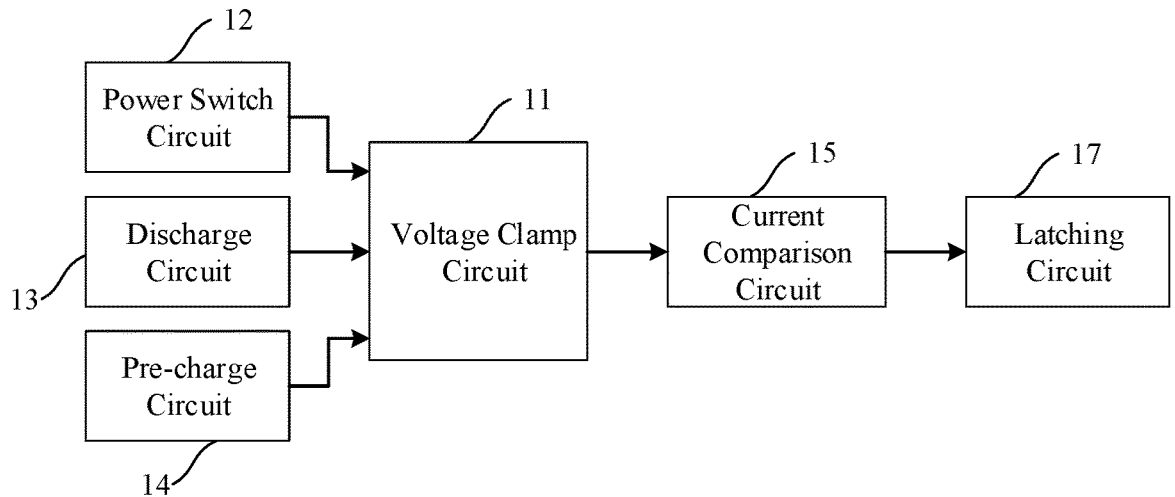
FIG. 1 shows a block diagram of a sensitive amplifier of the present disclosure.
Figure 2:
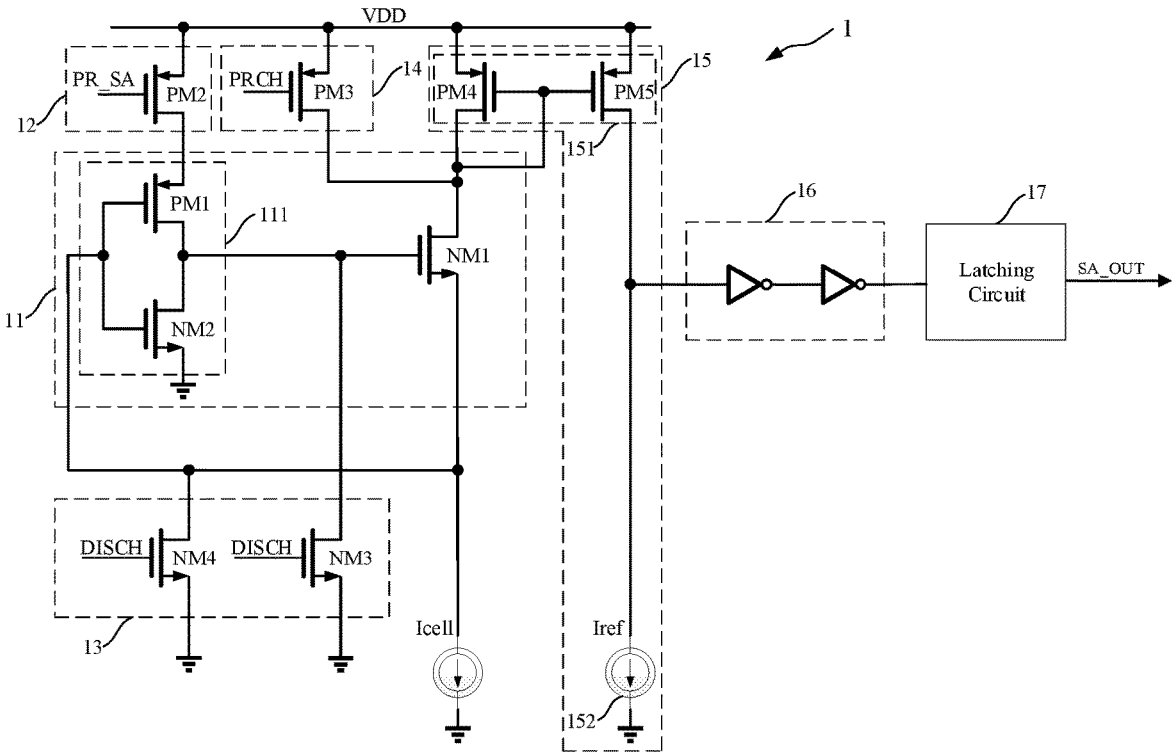
FIG. 2 shows a circuit diagram of a sensitive amplifier of the present disclosure.
Figure 3:
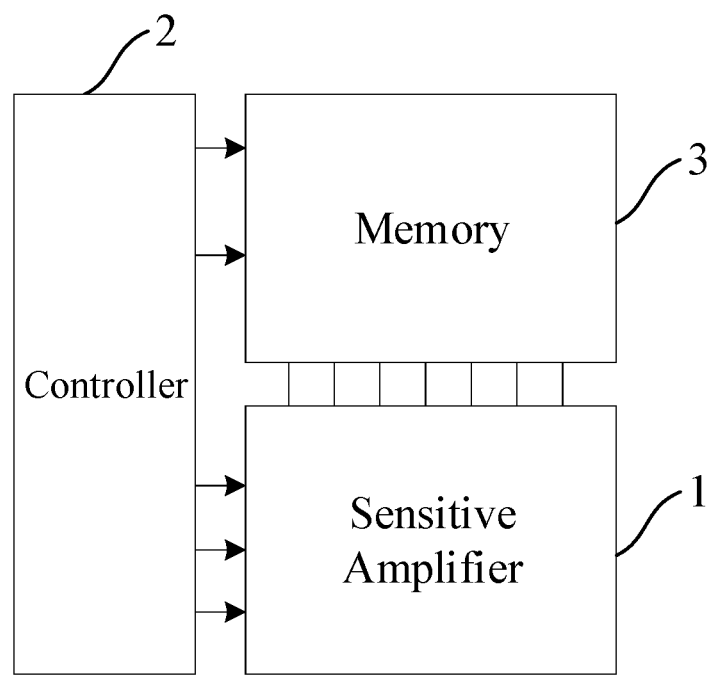
FIG. 3 shows a circuit diagram of a storage device of the present disclosure.

Please refer to FIG. 1-FIG. 3. It should be noted that the drawings provided in this disclosure only illustrate the basic concept of the present disclosure in a schematic way, so the drawings only show the components related to the present disclosure. The drawings are not necessarily drawn according to the number, shape and size of the components in actual implementation; during the actual implementation, the type, quantity and proportion of each component can be changed as needed, and the components' layout can also be more complicated.

Embodiment 1

As shown in FIGS. 1 and 2, this embodiment provides a sensitive amplifier 1 that includes a voltage clamp circuit 11, a power switch circuit 12, a discharge circuit 13, a pre-charge circuit 14, and a current comparison circuit 15.

As shown in FIG. 1, the voltage clamp circuit 11 is connected to a memory cell to provide a stable reading voltage for the memory cell.

Specifically, as shown in FIG. 2, in this embodiment, the voltage clamp circuit 11 includes an inverting module 111 and a clamp MOSFET. A first end of the clamp MOSFET is connected to the memory cell, a second end of the clamp MOSFET outputs a readout current, and a control end of the clamp MOSFET is connected to an output end of the inverting module 111; wherein an input end of the inverting module 111 is connected to the first end of the clamp MOSFET. As an example, the clamp MOSFET is an NMOS, noted as a first NMOS, NM1; a source of the first NMOS NM1 is connected to the memory cell, a drain of the first NMOS NM1 outputs the readout current, and a gate of the first NMOS NM1 is connected to the output end of the inverting module 111. As an example, the inverting module 111 includes a second NMOS NM2 and a first PMOS PM1; a source of the second NMOS NM2 is grounded and a drain of the second NMOS NM2 is connected to the drain of the first PMOS PM1 as the output end of the inverting module 111; the source of the first PMOS MOSFET PM1 receives an operating voltage; the gates of the second NMOS NM2 and the first PMOS PM1 are connected together as the input end of the inverting module 111.

It should be noted that, in actual implementation, the device(s) or parts that constitute the voltage clamp circuit 11 of this embodiment may be selected as needed, and the corresponding relationships of the terminals may be adjusted adaptively; further, any circuit that can provide a stable reading voltage for the memory cell is applicable to the present disclosure.

It should be noted that, as an example, the reading voltage is clamped at 0.8V-1.1V, in actual use, it may be adjusted as needed.

As shown in FIG. 1, the power switch circuit 12 is connected between a supply voltage VDD and the voltage clamp circuit 11 to cut off the path between the voltage clamp circuit 11 and the supply voltage VDD when the voltage clamp circuit 11 is not operating.

Specifically, as shown in FIG. 2, in this embodiment, the power switch circuit 12 includes a switching MOSFET; the switching MOSFET has a first end connected to the supply voltage VDD, a second end connected to the operating voltage input of the inverting module 111, and a control end receiving a first control signal PR_SA. As an example, the switching MOSFET is a PMOS, noted as a second PMOS, PM2, which has a source connected to the supply voltage VDD, a drain connected to the source of the first PMOS PM1, and a gate receiving the first control signal PR_SA.

It should be noted that in actual use, the device(s) or parts that constitute the power switch circuit 12 of this embodiment may be selected as needed, and the corresponding relationships of the terminals may be adjusted adaptively; further, any circuit where the path between the voltage clamp circuit and the supply voltage VDD can be cut off when no read operation is performed is applicable to the present disclosure.

As shown in FIG. 1, the discharge circuit 13 is connected to the voltage clamp circuit 11 to discharge the voltage clamp circuit 11 before the voltage clamp circuit 11 operates.

Specifically, as shown in FIG. 2, in this embodiment, the discharge circuit 13 includes a first pull-down MOSFET and a second pull-down MOSFET; wherein a first end of the first pull-down MOSFET is grounded and a second end of the first pull-down MOSFET is connected to the control end of the clamp MOSFET, and the control end of the first pull-down MOSFET receives a second control signal DISCH; wherein a first end of the second pull-down MOSFET is grounded, a second end of the second pull-down MOSFET is connected to the input end of the inverting module 111, and a control end of the second pull-down MOSFET receives the second control signal DISCH. As an example, the first pull-down MOSFET and the second pull-down MOSFET are both NMOS, noted as a third NMOS, NM3, and a fourth NMOS, NM4, respectively; the third NMOS NM3 has a grounded source and a drain connected to the gate of the first NMOS NM1, and the gate receives the second control signal DISCH; the fourth NMOS NM4 has a grounded source, a drain connected to the source of the first NMOS NM1 (i.e., the input of the inverting module 111), and a gate receiving the second control signal DISCH.

It should be noted that in actual use, the device(s) or parts that constitute the voltage clamp circuit 13 of this embodiment may be selected as needed, and the corresponding relationships of the terminals may be adjusted adaptively; further, any circuit where the voltage clamp circuit can be discharged before the read operation is applicable to the present disclosure.

As shown in FIG. 1, the pre-charge circuit 14 is connected to the voltage clamp circuit 11 to pre-charge the voltage clamp circuit 11 when the voltage clamp circuit 11 starts to operate.

Specifically, as shown in FIG. 2, in this embodiment, the pre-charging circuit 14 includes a pre-charging MOSFET, wherein a first end of the pre-charging MOSFET is connected to the supply voltage VDD, the second end of the pre-charging MOSFET is connected to the second end of the clamp MOSFET, and the control end of the pre-charging MOSFET receives a third control signal PRCH. As an example, the pre-charge MOSFET is a PMOS, noted as a third PMOS, PM3; the third PMOS PM3 has a source connected to the supply voltage VDD, a drain connected to the drain of the first NMOS, NM1, and a gate receiving the third control signal PRCH. The pre-charge circuit 14 is able to rapidly charge an expected voltage of the first NMOS, NM1, to a target range (i.e., 0.8V-1.1V).

It should be noted that in actual use, the device(s) or parts that constitute the voltage clamp circuit 14 of this embodiment may be selected as needed, and the corresponding relationships of the terminals may be adjusted adaptively; further, any circuit where the voltage clamp circuit can be pre-charged when the read operation is performed is applicable to the present disclosure.

As shown in FIG. 1, the current comparison circuit 15 is connected to the output of the voltage clamp circuit 11, compares the readout current with a reference current, and outputs the comparison result.

Specifically, as shown in FIG. 2, in this embodiment, the current comparison circuit 15 includes a current mirror 151 and a current source 152; one end of the current mirror 151 is connected to the output end of the voltage clamp circuit 11 that outputs the readout current, and the other end of the current mirror 151 is connected to the current source 152 and outputs the comparison result. As an example, the current mirror 151 includes PMOS, including a fourth PMOS PM4, and a fifth PMOS PM5; a drain and a gate of the fourth PMOS PM4 are connected to a drain of the first NMOS NM1, and a source of the fourth PMOS PM4 is connected to the supply voltage VDD; a source of the fifth PMOS PM5 is connected to the supply voltage VDD, a gate of the fifth PMOS PM5 is connected to the gate of the fourth PMOS PM4, and a drain of the fifth PMOS PM5 is connected to the current source 152; the drain of the fifth PMOS PM5 outputs the comparison result.

As shown in FIGS. 1 and 2, the sensitive amplifier 1 further includes, as an example, a buffer circuit 16 connected to the output end of the current comparison circuit 15. As an example, the buffer circuit 16 includes an even-stage series-connected inverter, and in actual use, the circuit structure of the buffer circuit 16 can be configured as needed.

As shown in FIG. 1 and FIG. 2, as an example, the sensitive amplifier 1 further includes a latching circuit 17 connected to the output of the current comparison circuit 15 for latching the comparison result and outputting an output signal SA_OUT of the sensitive amplifier 1, wherein data is latched after the read operation is completed and the corresponding output data remains unchanged until the next read operation. As another example, the latching circuit 17 is connected to the output of the buffer circuit 16.

The sensitive amplifier 1 operates as follows:

When the sensitive amplifier 1 is not operating, the first control signal PR_SA is the supply voltage VDD, the second control signal DISCH is grounded, the third control signal PRCH is the supply voltage VDD, and the latching circuit 17 is in the off state. At this time, the second PMOS PM2, the third PMOS PM3, the third NMOS NM3 and the fourth NMOS NM4 are off.

Then the read operation starts and the first stage of the read operation is a discharge stage. At this time, the first control signal PR_SA, the second control signal DISCH and the third control signal PRCH are all supply voltage VDD. At this time, the third NMOS NM3 and the fourth NMOS NM4 are turned on, and both the source and gate of the first NMOS NM1 are grounded; the second PMOS PM2 and the third PMOS PM3 are turned off. This operation is to assign an initial value (as an example, 0V) to the voltage at each point of the voltage clamp circuit 11 to prevent the initial value of the voltage at each point of the voltage clamp circuit 11 from floating to a relatively high value before the start of the read operation, and affecting the voltage to be clamped during the first read operation.

The second stage of the read operation is a pre-charge stage (where the voltage clamp circuit 11 starts to operate). The first control signal PR_SA, the second control signal DISCH, and the third control signal PRCH are grounded. At this time, the second PMOS PM2 and the third PMOS PM3 are turned on, and the voltages at the source of the first PMOS PM1 and the drain of the first NMOS NM1 are both supply voltage VDD; the third NMOS NM3 and the fourth NMOS NM4 are turned off. At this point the voltage clamp circuit 11 starts to operate and the source of the first NMOS NM1 is clamped to 0.8 V-1.1 V and remains stable.

The third stage of the read operation is a sense stage. The first control signal PR_SA is grounded, the second control signal DISCH is grounded, and the third control signal PRCH is the supply voltage VDD. At this time, the third PMOS PM3, the third NMOS NM3 and the fourth NMOS NM4 are turned off and the second PMOS PM2 is turned on. The drain current Icell of the memory cell is compared with the reference current Iref by means of a current mirror including the first NMOS NM1, the fourth PMOS PM4 and the fifth PMOS PM5. When the memory cell output a stable current during the read operation (i.e. Icell) that is greater than the reference current generated by an external circuit (i.e. Iref), a drain voltage of the fifth PMOS PM5 is charged to be the same as the supply voltage (VDD); when the stable current output by the memory cell during the read operation is less than the reference current generated by the external circuit, the drain voltage of the fifth PMOS PM5 is pulled down to be the same as the ground (i.e. 0V). During the sense stage, the latching circuit 17 is in the on state, at which time the sensitive amplifier 1 outputs sensed logic 0 or logic 1.

After the sensing stage is completed, the sensitive amplifier 1 again enters a to non-operating state. At this time the first control signal PR_SA is the supply voltage VDD, the second control signal DISCH is grounded, the third control signal PRCH is the supply voltage VDD, and the latching circuit 17 is in the off state.

It should be noted that, when the sensitive amplifier 1 is not operating, because the previously executed read operation clamps the source voltage of the first NMOS at 0.8V-1.11V, if the first PMOS PM1 and the second NMOS NM2 are simultaneously conducted, unnecessary standby power consumption will result. In the present disclosure, the current path from the supply voltage VDD through the second PMOS PM2, the first PMOS PM1, and the second NMOS NM2 to ground is cut off by the power switch circuit 12 during non-operation and discharge stages of the sensitive amplifier 1, to avoid unnecessary current loss and thus saving power consumption.

Embodiment 2

As shown in FIG. 3, this embodiment provides a storage device, including a sensitive amplifier 1, a controller 2, and a memory 3.

As shown in FIG. 3, the controller 2 is connected to the memory 3 and the sensitive amplifier 1 to provide control signals for the memory 3 and the sensitive amplifier 1.

Specifically, the controller 2 includes, but is not limited to, a CPU, and an MCU, and any device capable of implementing control of the memory and the sensitive amplifier is applicable.

As shown in FIG. 3, the memory 3 is used to store data.

Specifically, the memory 3 includes, but is not limited to, a non-volatile memory, and any storage medium capable of storing data is applicable to the present disclosure.

As shown in FIG. 3, the sensitive amplifier 1 is connected to the memory 3 for reading out the data stored in the memory 3.

The structure and operating principle of the sensitive amplifier 1 are similar to the descriptions of Embodiment 1.

In summary, the present disclosure provides a sensitive amplifier and a storage device; the sensitive amplifier includes: a voltage clamp circuit, which provides a stable reading voltage for the storage unit; a power switch circuit, which cuts off power supply for the voltage clamp circuit when the voltage clamp circuit is not operating; a discharge circuit, which discharges the voltage clamp circuit before the voltage clamp circuit operates; a pre-charge circuit, which pre-charges the voltage clamp circuit when the voltage clamp circuit starts operating; and a current comparison circuit, which is connected to an output of the voltage clamp circuit, compares the reading current with a reference current, and outputs a comparison result.

The sensitive amplifier and storage device of the present disclosure can effectively reduce the standby power consumption of a sensitive amplifier by cutting off the path between a voltage clamp circuit and a supply voltage by a power switch circuit when no reading operation is performed; the sensitive amplifier and storage device of the present disclosure can effectively improve the speed of pre-charging a clamp voltage of the sensitive amplifier by pre-charging the voltage clamp circuit before the read operation; the sensitive amplifier and storage device of the present disclosure can effectively prevent the sensitive amplifier from being in an unstable state internally by zeroing the potential at each point of the voltage clamp circuit before the read operation through a discharge circuit. Therefore, the present disclosure effectively overcomes various shortcomings of the prior art and has a high value for industrial application.

The above-mentioned embodiments only exemplarily illustrate the principles and effects of the present disclosure, but are not used to limit the present disclosure. Any person skilled in the art may modify or change the above embodiments without violating the spirit and scope of the present disclosure. Therefore, all equivalent modifications or changes made by those skilled in the art without departing from the spirit and technical concepts disclosed by the present disclosure should still be covered by the attached claims of the present disclosure.

What is claimed is:

1. A sensitive amplifier, comprising:
a voltage clamp circuit, connected to a memory cell to provide a stable reading voltage for the memory cell;
a power switch circuit, connected between a supply voltage and the voltage clamp circuit, wherein the power switch circuit cuts off a path between the voltage clamp circuit and the supply voltage when the voltage clamp circuit is not operating;
a discharge circuit, connected to the voltage clamp circuit, wherein the discharge circuit discharges the voltage clamp circuit before the voltage clamp circuit operates;
a pre-charge circuit, connected to the voltage clamp circuit, wherein the precharge circuit charges the voltage clamp circuit when the voltage clamp circuit starts to operate; and
a current comparison circuit, connected to an output end of the voltage clamp circuit, wherein the current comparison circuit compares a readout current at the output end of the voltage clamp circuit with a reference current and outputs a comparison result,
wherein the voltage clamp circuit comprises an inverting module and a clamp metal-oxide-semiconductor field-effect transistor (MOSFET); wherein a first end of the clamp MOSFET is connected to the memory cell, a second end of the clamp MOSFET outputs the readout current, and a control end of the clamp MOSFET is connected to an output end of the inverting module; and wherein an input end of the inverting module is connected to the first end of the clamp MOSFET;
wherein the discharge circuit comprises a first pull-down MOSFET and a second pull-down MOSFET; wherein a first end of the first pull-down MOSFET is grounded and a second end of the first pull-down MOSFET is connected to the control end of the clamp MOSFET, and the control end of the first pull-down MOSFET receives a second control signal; and wherein a first end of the second pull-down MOSFET is grounded, a second end of the second pull-down MOSFET is connected to the input end of the inverting module, and a control end of the second pull-down MOSFET receives the second control signal.

2. The sensitive amplifier according to claim 1, further comprising
a latching circuit, wherein the latching circuit is connected to an output of the current comparison circuit for latching the comparison result.

3. The sensitive amplifier according to claim 2, further comprising
a buffer circuit connected between the current comparison circuit and the latching circuit.

4. The sensitive amplifier according to claim 1, wherein the reading voltage is clamped between 0.8 V and 1.1 V.

5. The sensitive amplifier according to claim 1, wherein the power switch circuit comprises a switching MOSFET,
a first end of the switching MOSFET is connected to a supply voltage,
a second end of the switch circuit is connected to an input of the operating voltage of the inverting module, and
a control end of the switching MOSFET receives a first control signal.

6. The sensitive amplifier according to claim 1,
wherein the pre-charging circuit comprises a pre-charging MOSFET; and
wherein a first end of the pre-charging MOSFET is connected to the supply voltage, a second end of the pre-charging MOSFET is connected to the second end of the clamp MOSFET, and a control end of the pre-charging MOSFET receives a third control signal.

7. The sensitive amplifier according to claim 1, wherein the current comparison circuit comprises a current mirror and a current source, one end of the current mirror is connected to the output end of the voltage clamp circuit that outputs the readout current, and the other end of the current mirror is connected to the current source and outputs the comparison result.

8. A storage device, wherein the storage device comprises: a controller, a memory, and a sensitive amplifier; wherein the sensitive amplifier comprises:

a voltage clamp circuit, connected to a memory cell to provide a stable reading voltage for the memory cell;

a power switch circuit, connected between a supply voltage and the voltage clamp circuit, wherein the power switch circuit cuts off a path between the voltage clamp circuit and the supply voltage when the voltage clamp circuit is not operating;

a discharge circuit, connected to the voltage clamp circuit, wherein the discharge circuit discharges the voltage clamp circuit before the voltage clamp circuit operates;

a pre-charge circuit, connected to the voltage clamp circuit, wherein the precharge circuit charges the voltage clamp circuit when the voltage clamp circuit starts to operate; and a current comparison circuit, connected to an output end of the voltage clamp circuit, wherein the current comparison circuit compares a readout current at the output end of the voltage clamp circuit with a reference current and outputs a comparison result;

wherein the controller is connected to the memory and the sensitive amplifier, and provides control signals for the memory and the sensitive amplifier;

wherein the memory is used for storing data;

wherein the sensitive amplifier is connected to the memory for reading out data stored in the memory;

wherein the voltage clamp circuit comprises an inverting module and a clamp metal-oxide-semiconductor field-effect transistor (MOSFET); wherein a first end of the clamp MOSFET is connected to the memory cell, a second end of the clamp MOSFET outputs the readout current, and a control end of the clamp MOSFET is connected to an output end of the inverting module; and wherein an input end of the inverting module is connected to the first end of the clamp MOSFET;

wherein the discharge circuit comprises a first pull-down MOSFET and a second pull-down MOSFET; wherein a first end of the first pull-down MOSFET is grounded and a second end of the first pull-down MOSFET is connected to the control end of the clamp MOSFET, and the control end of the first pull-down MOSFET receives a second control signal; and wherein a first end of the second pull-down MOSFET is grounded, a second end of the second pull-down MOSFET is connected to the input end of the inverting module, and a control end of the second pull-down MOSFET receives the second control signal.

9. The storage device according to claim 8, wherein the memory is a non-volatile memory.

* * * * *